(12) United States Patent
McIsaac

(10) Patent No.: US 12,061,216 B2
(45) Date of Patent: Aug. 13, 2024

(54) APPARATUS AND METHOD FOR DETECTING ELECTRICAL CURRENT FLOW

(71) Applicant: Andrew McIsaac, Edmonton (CA)

(72) Inventor: Andrew McIsaac, Edmonton (CA)

(*) Notice: Subject to any disclaimer, the term of this patent is extended or adjusted under 35 U.S.C. 154(b) by 0 days.

(21) Appl. No.: 17/952,197

(22) Filed: Sep. 23, 2022

(65) Prior Publication Data

US 2023/0096791 A1 Mar. 30, 2023

Related U.S. Application Data

(60) Provisional application No. 63/249,691, filed on Sep. 29, 2021.

(51) Int. Cl.
*G01R 19/15* (2006.01)

(52) U.S. Cl.
CPC .................... *G01R 19/15* (2013.01)

(58) Field of Classification Search
CPC ................. G01R 19/15; G01R 1/025
USPC ........................................ 324/76.11
See application file for complete search history.

(56) References Cited

U.S. PATENT DOCUMENTS

| | | | |
|---|---|---|---|
| 6,424,136 B1 * | 7/2002 | Gardner | G01R 19/15 324/133 |
| 9,575,091 B2 * | 2/2017 | Reeder, III | G01R 1/0408 |
| 10,072,942 B2 * | 9/2018 | Wootton | G01R 11/04 |
| 2011/0210717 A1 * | 9/2011 | Hilton | H02G 3/00 324/66 |
| 2012/0280822 A1 * | 11/2012 | Kuo | G01R 15/202 340/664 |
| 2014/0117780 A1 * | 5/2014 | Buchheim | G01R 21/133 307/112 |
| 2014/0266171 A1 * | 9/2014 | Mosser | G01R 22/061 324/228 |
| 2015/0088331 A1 * | 3/2015 | Fiedler | G08C 15/00 700/295 |
| 2016/0313377 A1 * | 10/2016 | Bolin | G07C 3/04 |
| 2017/0185237 A1 * | 6/2017 | Bitsch | G01R 21/133 |
| 2020/0309825 A1 * | 10/2020 | Arredondo | G01R 19/0092 |

* cited by examiner

*Primary Examiner* — Christopher P McAndrew
(74) *Attorney, Agent, or Firm* — FOLEY & LARDNER LLP

(57) ABSTRACT

An apparatus and method for detecting the flow of electrical current through an electrical connector or outlet to an electrical load.

20 Claims, 7 Drawing Sheets

Process 1100

APPARATUS AND METHOD FOR DETECTING ELECTRICAL CURRENT FLOW

CROSS-REFERENCE TO RELATED APPLICATIONS

This application claims priority of U.S. provisional patent application Ser. No. 63/249,691 filed Sep. 29, 2021, which is incorporated by reference into this application in its entirety.

TECHNICAL FIELD

The present disclosure is related to the field of apparatuses for detecting electrical current draw from electrical loads, in particular, electrical power receptacles for detecting electrical current drawn by electrical loads connected thereto.

BACKGROUND

There are devices available that purport to provide visual indication that electrical power is present. For example, as shown in FIGS. 1 and 2, electrical plug A and electrical connector B each comprise a light emitting diode (LED) disposed therein and operatively coupled to the electrical terminals disposed in plug A and connector B, respectively, that can illuminate when they are connected to a source of electrical power such as 120 volt, 60 hertz single-phase alternating current power as widely available in North America.

The problem with these prior art devices is that illuminated power plugs that are currently on the market are said to be a "Power Indicator". Such statements are not accurate as these devices only provide a visual indication that there is an electrical voltage potential present at the electrical terminals of the device; the device does not provide any indication or reference to electrical current flowing through the device and, therefore, cannot provide any indication of electrical power passing therethrough as defined by Watt's Law as:

Power(in watts)=Voltage(in volts)×Current(in amps)

One example of a use for such a device is on an extension power cord for connecting a motor vehicle's block heater cord to. Referring to FIGS. 3 and 4, an extension cord having electrical connector B is connected to block heater plug D on motor vehicle C.

The inventor discovered firsthand that with this situation, simply having electrical connector B illuminate to indicate the presence of electrical power does not provide any indication that electrical power is actually being transferred to the block heater connected to plug D. On a cold winter night, the inventor had plugged in the block heater of vehicle D only to discover that the vehicle would not start the next morning as the engine was too cold to turn over notwithstanding that plug D was connected to connector B. The inventor then discovered that electrical wires from plug D to the block heater were damaged and, thus, the connection from plug D to the block heater was open circuit resulting in no electrical current flowing to the block heater despite plug D being connected to connector C.

It is, therefore, desirable to provide an electrical connection apparatus that provides an indication of electrical current flowing therethrough when an electrical load is connected to the apparatus.

SUMMARY

An apparatus and method for detecting electrical current flow is provided. In some embodiments, the apparatus can comprise an electrical power plug that can illuminate when electrical current is actually flowing through the plug, to indicate that electrical power is being consumed by the electrical load connected to the plug, and not just an indicator that electrical voltage is present at the terminal of the plug.

This can be implemented in several ways. In some embodiments, the apparatus can function with a light on/off indicator; if electrical power is being used by the load connected to the application, that is, electrical current is flowing through the application, then the light can turn on to provide a visual indication of same.

In other embodiments, the apparatus can comprise a variable visual display such as an arrangement of LED's that can provide a visual indicator of how much electrical current is being drawn by an electrical load connected to the apparatus.

In further embodiments, the apparatus can comprise a Wi-Fi® connection to send information regarding the electrical current flowing through the application to a remote display or computing device, or over an internet connection to a website or a smart device, such as a smart phone or tablet, to provide this information.

In some embodiments, the apparatus can comprise a microcontroller, an electrical current sensor and one or more of an LED indicator, an LED bar graph display and a Wi-Fi® connection.

For the purposes of this specification, and the claims that follow, it shall be understood that the terms "light emitting diode (LED)" and "light emitting diodes (LEDs)" shall be interpreted as including all means, contrivances and devices known to those skilled in the art configured to emit light or to otherwise provide a visual indication when operated or illuminated, and not limited to just devices comprising of light emitting diodes.

Broadly stated, in some embodiments, an apparatus can be provided for detecting electrical current flowing through an electrical connector to an electrical load connected thereto, the apparatus comprising: a current sensor operatively coupled to the connector wherein the current sensor is configured to detect the flow of the electrical current through the connector; a microcontroller operatively coupled to the current sensor; and a visual display device operatively coupled to the microcontroller wherein the microcontroller comprises a first executable software program or code that causes the microcontroller to illuminate the visual display device when the electrical current is flowing through the connector.

Broadly stated, in some embodiments, the visual display device can comprise at least one light emitting diode (LED).

Broadly stated, in some embodiments, the microcontroller can comprise a second executable software program or code that causes the microcontroller to illuminate the at least one LED when the electrical current is flowing through the connector, the number of the plurality of LEDs illuminated proportional to the amount of the electrical current flowing through the electrical connector.

Broadly stated, in some embodiments, the visual display device can comprise a plurality of different coloured light emitting diodes (LEDs) or an LED configured to emit different colours of light.

Broadly stated, in some embodiments, wherein the microcontroller can comprise a third executable software program or code that causes the microcontroller to illuminate one or more of the plurality of different coloured LEDs when the electrical current is flowing through the connector, the colour of the plurality of different coloured LEDs illuminated being a function of the amount of the electrical current flowing through the electrical connector.

Broadly stated, in some embodiments, wherein the microcontroller can comprise an executable software program or code that causes the microcontroller to operate the visual display to emit light when the electrical current is flowing through the connector, the colour of the emitted light representing the amount of the electrical current flowing through the electrical connector.

Broadly stated, in some embodiments, the apparatus can further comprise a wireless transceiver module operatively coupled to the microcontroller, wherein the microcontroller comprises a fourth executable software program or code that causes the microcontroller to relay information relating to the electrical current flowing through the electrical connector to the wireless transceiver module, the wireless transceiver module configured to wirelessly transmit the information to one or more of a smart device, a general purpose computer and a world-wide telecommunications network.

Broadly stated, in some embodiments, a method can be provided for detecting electrical current flowing through an electrical connector to an electrical load connected thereto, the method comprising: detecting the current flow through the electrical connector with a current sensor, the current sensor operatively coupled to a microcontroller; and illuminating a visual display device with the microcontroller, wherein the microcontroller comprises a first executable software program or code that causes the microcontroller to illuminate the visual display device when the electrical current is flowing through the connector.

Broadly stated, in some embodiments, the method can further comprise illuminating the at least one LED with the microcontroller, wherein the microcontroller comprises a second executable software program or code that causes the microcontroller to illuminate the at least one LED when the electrical current is flowing through the connector, the number of the at least one LED illuminated proportional to the amount of the electrical current flowing through the electrical connector.

Broadly stated, in some embodiments, the method can further comprise illuminating one or more of the plurality of different coloured LEDs with the microcontroller, wherein the microcontroller comprises a third executable software program or code that causes the microcontroller to illuminate one or more of the plurality of different coloured LEDs when the electrical current is flowing through the connector, the colour of the plurality of different coloured LEDs illuminated being a function of the amount of the electrical current flowing through the electrical connector.

Broadly stated, in some embodiments, the method can further comprise operating the visual device with the microcontroller, wherein the microcontroller comprises an executable software program or code that causes the microcontroller to operate the visual display to emit light when the electrical current is flowing through the connector, the colour of the emitted light representing the amount of the electrical current flowing through the electrical connector.

Broadly stated, in some embodiments, the method can further comprise wirelessly transmitting information relating to the electrical current flowing through the electrical connector to one or more of a smart device, a general purpose computer and a world-wide telecommunications network with a wireless transceiver module, wherein the microcontroller comprises a fourth executable software program or code that causes the microcontroller to relay the information to the wireless transceiver module.

DETAILED DESCRIPTION OF EMBODIMENTS

Figure 1:
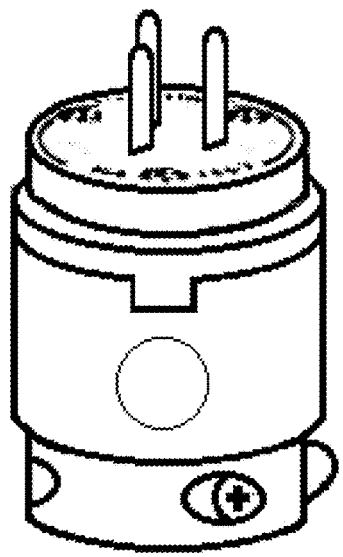
FIG. 1 is a front perspective view depicting a prior art electrical plug with visual power indicator.
Figure 2:
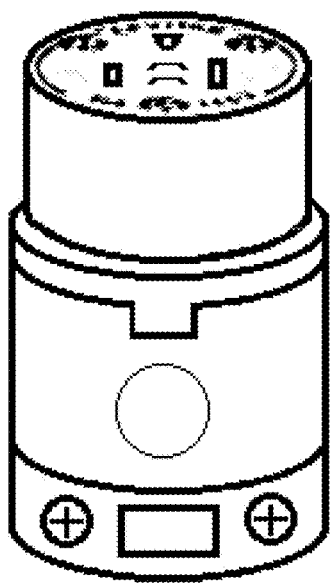
FIG. 2 is a front perspective view depicting a prior art electrical connector with visual power indicator.
Figure 3:
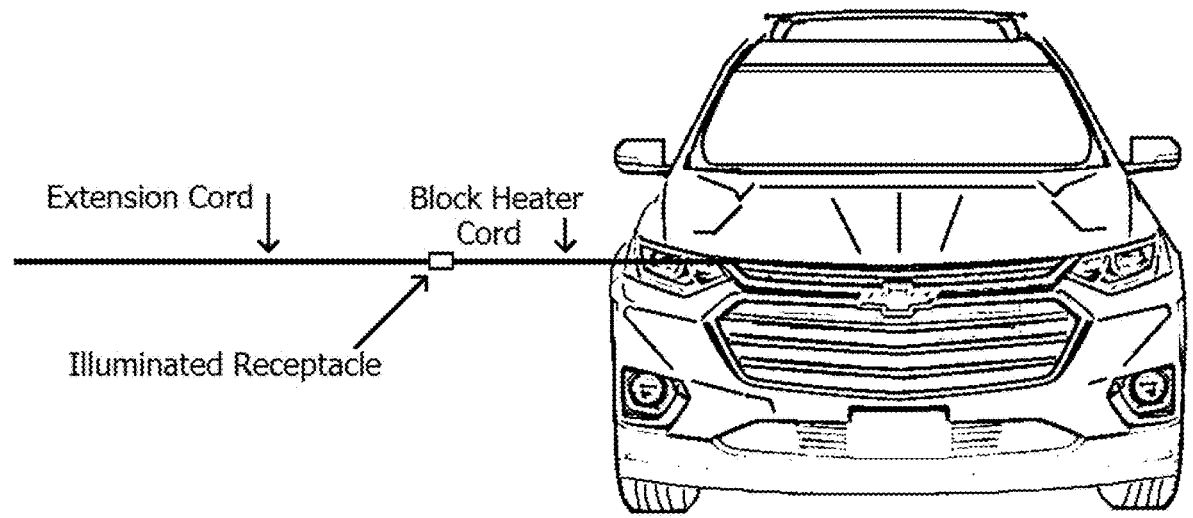
FIG. 3 is a front perspective view depicting an electrical cord having the electrical connector of FIG. 2 connected to a block heater cord plug on a motor vehicle.
Figure 4:
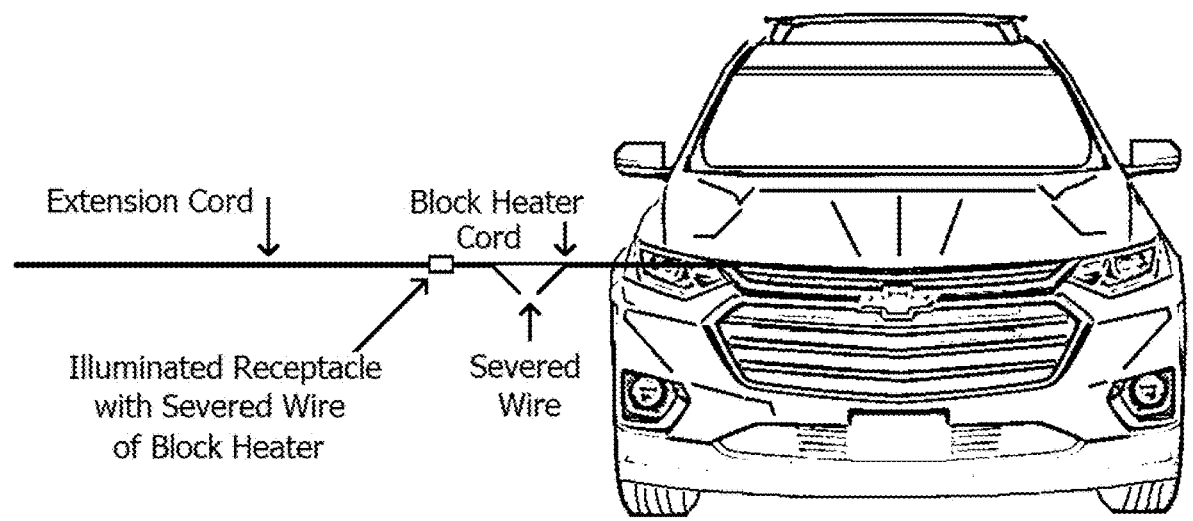
FIG. 4 is a close-up perspective view depicting the electrical connection of FIG. 3.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment can also be included in other embodiments but is not necessarily included. Thus, the present technology can include a variety of combinations and/or integrations of the embodiments described herein.

The presently disclosed subject matter is illustrated by specific but non-limiting examples throughout this description. The examples may include compilations of data that are representative of data gathered at various times during the course of development and experimentation related to the present invention(s). Each example is provided by way of explanation of the present disclosure and is not a limitation thereon. In fact, it will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

All references to singular characteristics or limitations of the present disclosure shall include the corresponding plural characteristic(s) or limitation(s) and vice versa, unless otherwise specified or clearly implied to the contrary by the context in which the reference is made.

All combinations of method or process steps as used herein can be performed in any order, unless otherwise specified or clearly implied to the contrary by the context in which the referenced combination is made.

While the following terms used herein are believed to be well understood by one of ordinary skill in the art, definitions are set forth to facilitate explanation of the presently disclosed subject matter.

Unless defined otherwise, all technical and scientific terms used herein have the same meaning as commonly understood by one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a", "an", and "the" refer to "one or more" when used in this application, including the claims.

Unless otherwise indicated, all numbers expressing quantities, properties, and so forth used in the specification and claims are to be understood as being modified in all instances by the term "about". Accordingly, unless indicated to the contrary, the numerical parameters set forth in this specification and claims are approximations that can vary depending upon the desired properties sought to be obtained by the presently disclosed subject matter.

As used herein, the term "about", when referring to a value or to an amount of mass, weight, time, volume, concentration or percentage is meant to encompass variations of in some embodiments+/−50%, in some embodiments+/−40%, in some embodiments+/−30%, in some embodiments+/−20%, in some embodiments+/−10%, in some embodiments+/−5%, in some embodiments+/−1%, in some embodiments+/−0.5%, and in some embodiments+/−0.1% from the specified amount, as such variations are appropriate to perform the disclosed method.

Alternatively, the terms "about" or "approximately" can mean within an acceptable error range for the particular value as determined by one of ordinary skill in the art, which will depend in part on how the value is measured or determined, i.e., the limitations of the measurement system. For example, "about" can mean within 3, or more than 3, standard deviations, per the practice in the art. Alternatively, "about" can mean a range of up to 20%, preferably up to 10%, more preferably up to 5%, and more preferably still up to 1 of a given value. Alternatively, particularly with respect to biological systems or processes, the term can mean within an order of magnitude, preferably within 5-fold, and more preferably within 2-fold, of a value. Unless otherwise indicated, all numbers expressing quantities, properties, and so forth used in the specification and claims are to be understood as being modified in all instances by the term "about". And so, the numerical parameters set forth in this specification and claims are approximations that can vary depending upon the desired properties sought to be obtained by the presently disclosed subject matter.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

Figure 5:
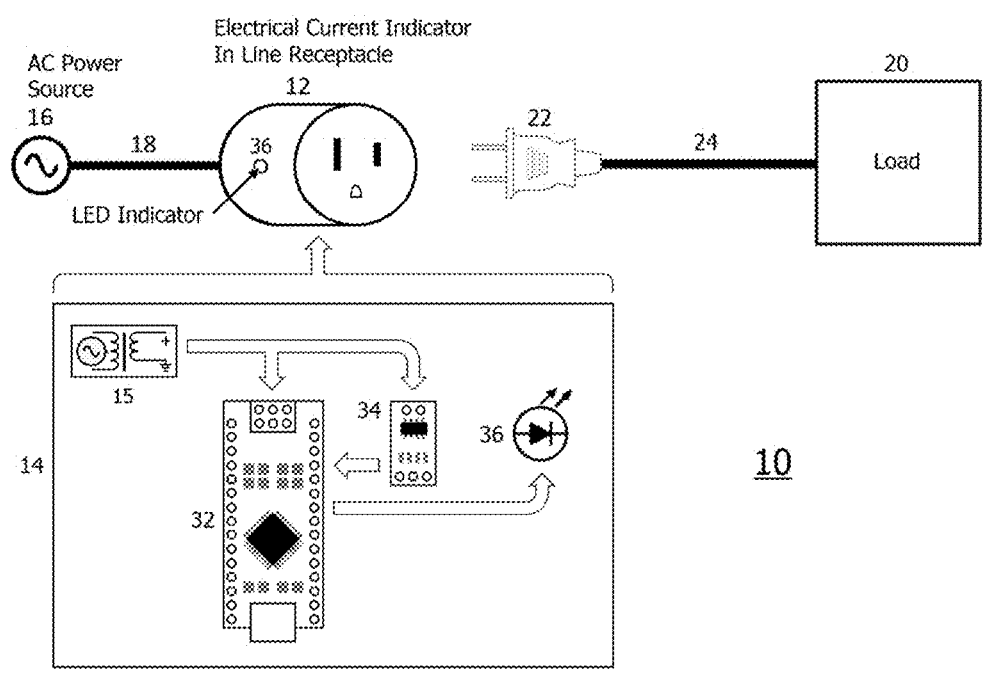
FIG. 5 is a block diagram depicting a first embodiment of an apparatus that indicates the flow of electrical current therethrough.
Figure 6:
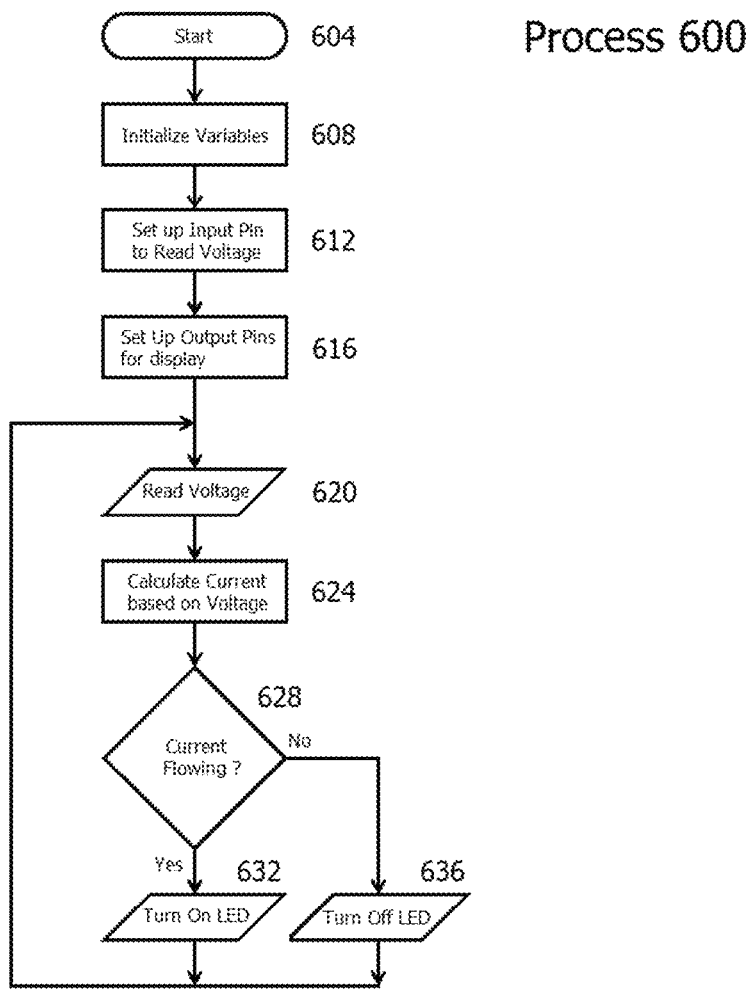
FIG. 6 is a flow chart depicting one embodiment of steps carried out by the apparatus of FIG. 5.
Figure 7:
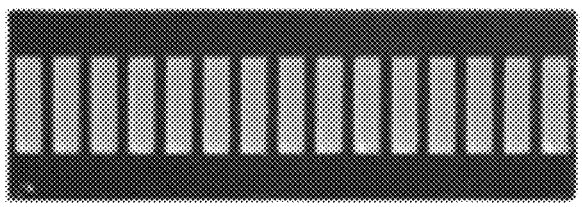
FIG. 7 is a perspective view depicting a multi-LED display for use with a second embodiment of the apparatus of FIG. 5.

Referring to FIG. 5, one embodiment of electrical current detecting apparatus 10 is shown. In some embodiments, apparatus 10 can comprise of electrical connector 12 having current detecting module 14 disposed therein. In some embodiments, module 14 can comprise of current sensor 34 operatively coupled to connector 12 such that any electrical current flowing through connector 12 can flow through current sensor 34, which can also be operatively coupled to microcontroller 32. In some embodiments, microcontroller 32 and current sensor 34 can be operatively powered by power module 15 that be configured to convert AC power source 16 to a suitable DC voltage, such as 5 volts DC or 3.3 volts DC or other suitable DC voltage, for powering microcontroller 32 and current sensor 34 as well known to those skilled in the art. Microcontroller 32 can be operatively coupled to LED 36 and programmed with an executable software program or code wherein electrical current flowing through connector 12 and, thus, current sensor 34 can cause microcontroller 32 to illuminate a visual display device such as LED 36 to provide a visual indicator that electrical current is, in fact, flowing through connector 12. In the illustrated embodiment, LED 36 can illuminate when alternating current ("AC") electrical power source 16 flows to electrical plug 22 via cable 18 to connector 12, which then can subsequently flow through cable 24 to electrical load 20. In some embodiments, microcontroller 32 can comprise of an Arduino Nano microcontroller as manufactured by Arduino SA of Chiasso, Switzerland although any similarly functioning microcontroller can be used as well known to those skilled in the art. In some embodiments, current sensor 34 can comprise of an ASC712 current sensor as manufactured by Arduino SA of Chiasso, Switzerland although any similarly functioning current sensor can be used as well known to those skilled in the art. Referring to FIG. 6, one embodiment of process 600 that can be carried out by apparatus 10 of FIG. 5 is shown. In some embodiments, process 600 can start at step 604 and then initialize operating variables of microcontroller 32 at step 608. At step 612, input pins of microcontroller 32 can be configured to read voltage from current sensor 34 whereas at step 616, output pins of microcontroller 32 can be configured to operate a display device, such as LED 36. At step 620, microcontroller 32 can read an output voltage from current sensor 34 that can be proportional to the current from connector 12 to load 20. At step 624, microcontroller 32 can calculate the current flowing to load 20 from the voltage read from current sensor 34. At step 628, microcontroller 32 can determine if current is flowing to load 20 based on the voltage read at step 620. If microcontroller 32 determines that no current is flowing to load 20, then LED 36 can be turned off (or kept off as the case may be) at step 636. If microcontroller 32 determines that current is flowing to load 20, LED 36 can be turned on (or kept on as the case may be) at step 632. In some embodiments, from step 632 or 636, process 600 can then return to step 620 and repeat steps 620 to 632 or 636.

Figure 8:
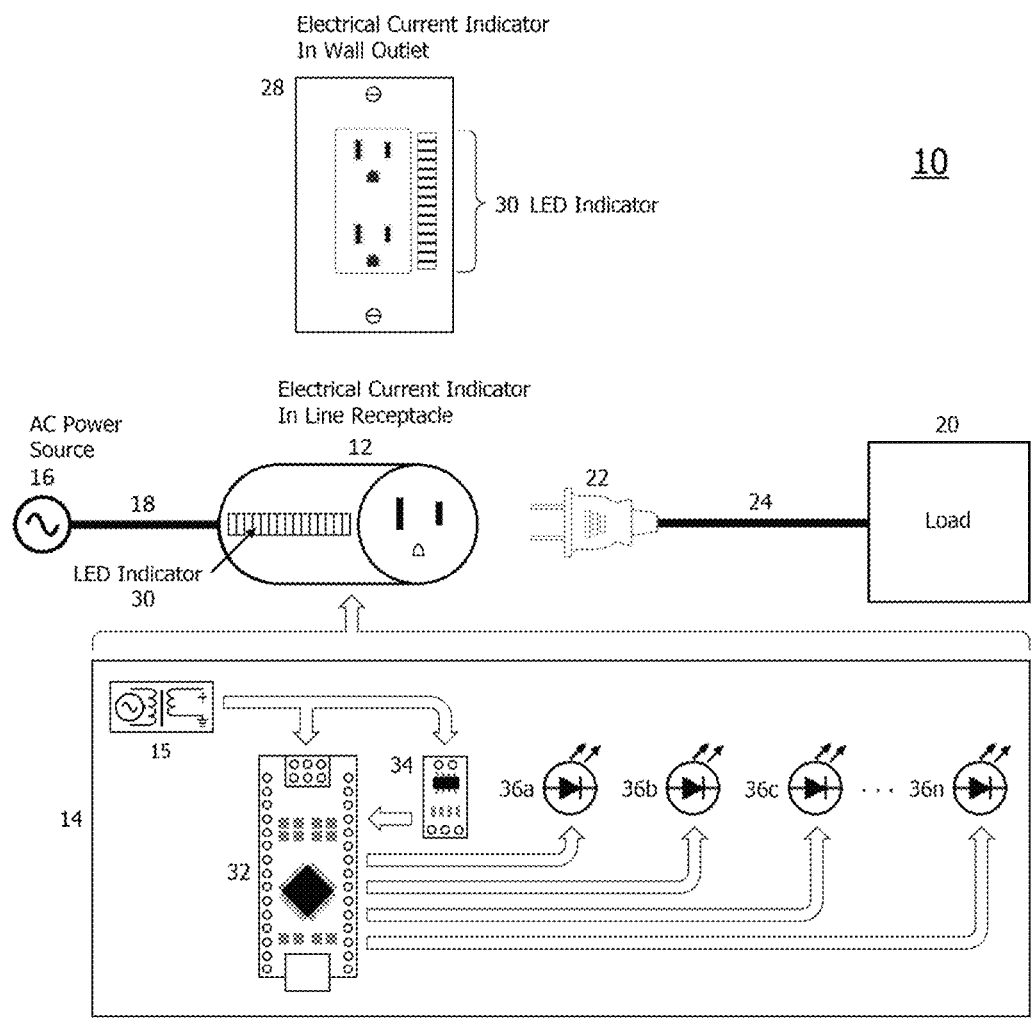
FIG. 8 is a block diagram depicting a second embodiment of an apparatus that indicates the flow of electrical current therethrough.

Referring to FIG. 8, a second embodiment of apparatus 10 is shown, which can comprise multi-segment LED display 30 as a visual indicator as to the relative amount of electrical current flowing through apparatus 10 wherein the number of LED segments illuminated in display 30 can be proportional to, a function of, or representative of the amount of electrical current flowing through apparatus 10. In some embodiments, module 14 of this embodiment can be similar to that used with the embodiment shown in FIG. 5 except that there can be more outputs from microcontroller 32 to multiple LEDs shown as 36a, 36b, 36c . . . 36n as shown in FIG. 8. In some embodiments, microcontroller 32 can be programmed with an executable software program or code such that each LED 36 in display 30 can represent 1 amp of electrical current flowing, that is, one LED 36 illuminated indicates 1 amp of current flowing, two LEDs 36 illuminated indicates 2 amps of current flowing, and so on. In some embodiments, LED display 30 can comprise a plurality of LEDs where the LEDs can be all the same colour or can comprise a plurality of different colours, such as green, yellow, red, and so on. Thus, in some embodiments, microcontroller 32 can be programmed with an executable software program or code such that a predetermined number of LEDs or, in other embodiments, different colours of the LEDs can represent different amounts of current flowing through apparatus 10. For example, in North America, a typical electrical outlet, shown as outlet 28 in FIG. 8, is limited to a maximum of 15 amps before a circuit breaker supplying electrical current to outlet 28 will trip to prevent more than 15 amps being supplied to outlet 28. In such embodiments, microcontroller 32 can be programmed with an executable software program or code that can cause microcontroller 32 to illuminate green LEDs 36 if the electrical current flowing through apparatus 10 is about 10 amps or less, as an example. If the current flowing through apparatus 10 is about in the range of 10 to 12 amps, microcontroller 32 can be programmed with an executable software program or code that can cause microcontroller 32 to illuminate yellow LEDs 36 in addition to green LEDs 36. If the current flowing through apparatus 10 is about 12 amps or more, which represents about 80% of the maximum amount of electrical current supplied the aforementioned circuit breaker, microcontroller 32 can be programmed with an executable software program or code that can cause microcontroller 32 to illuminate red LEDs 36 in addition to yellow and green LEDs 36. In some embodiments, apparatus 10 can comprise a singular LED device that can comprise a plurality of LEDs 36 of different colour or one or more LEDs 36 each configured to emit more than one colour, such that the LED device can emit different colours wherein the colour emitted can be proportional to, a function of, or representative of the amount of electrical current flowing through apparatus 10. For example, the LED device can emit green light if the current flowing through apparatus 10 is about 10 amps or less; the LED device can emit yellow light if the current flowing through apparatus 10 is between about 10 and 12 amps; and the LED device can emit red light if the current flowing through apparatus 10 is about 12 amps or more.

Figure 9:
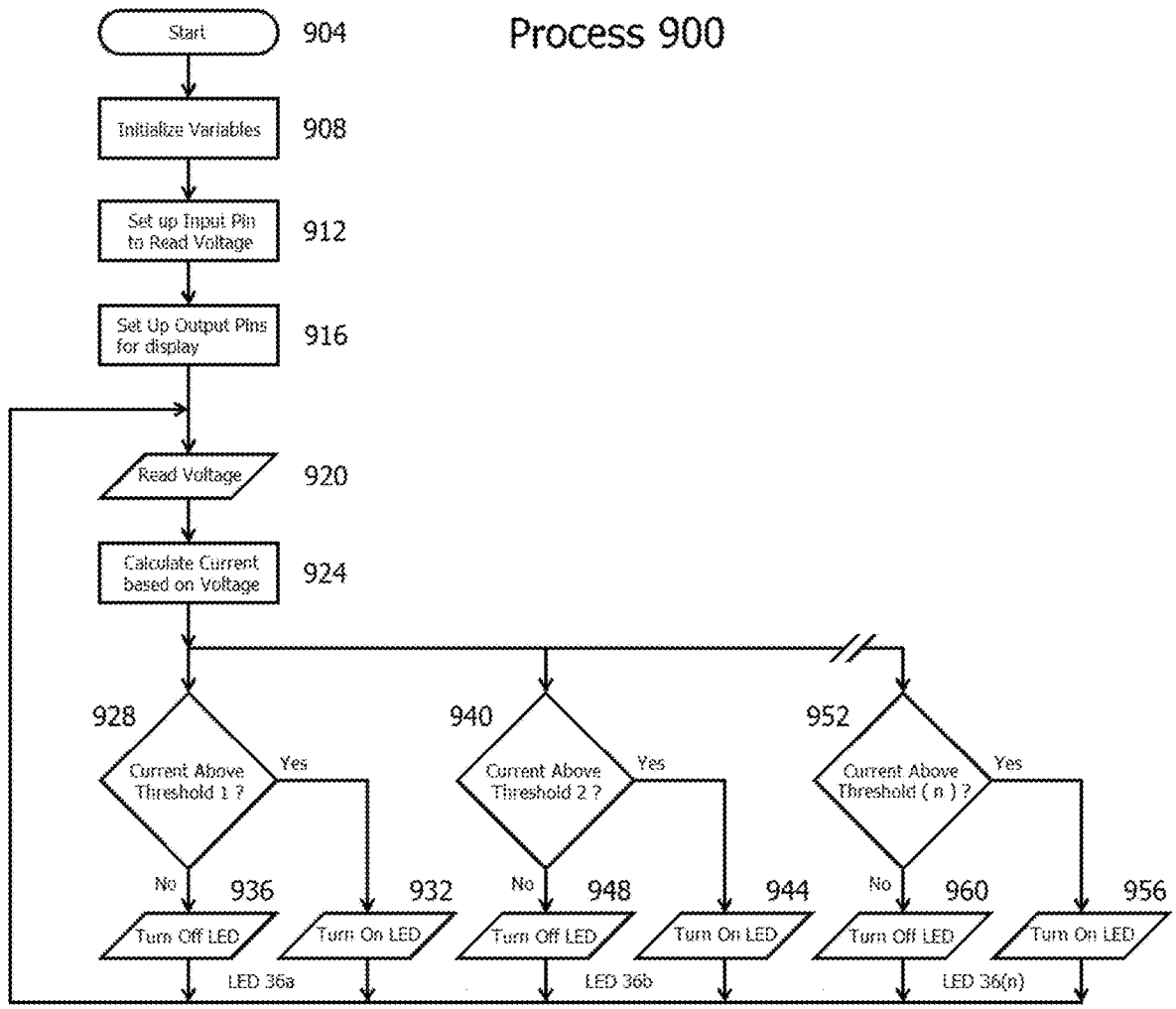
FIG. 9 is a flow chart depicting one embodiment of steps carried out by the apparatus of FIG. 8.

In some embodiments, LED display 30 can be disposed in connector 12, as shown in FIG. 5, or disposed in outlet 28, as shown in FIG. 8. Referring to FIG. 9, one embodiment of process 900 that can be carried out by apparatus 10 of FIG. 8 is shown. In some embodiments, process 900 can start at step 904 and then initialize operating variables of microcontroller 32 at step 908. At step 912, input pins of microcontroller 32 can be configured to read voltage from current sensor 34 whereas at step 916, output pins of microcontroller 32 can be configured to operate a display device, such as LED display 30. At step 920, microcontroller 32 can read an output voltage from current sensor 34 that can be proportional to the current from connector 12 to load 20. At step 924, microcontroller 32 can calculate the current flowing to load 20 from the voltage read from current sensor 34. At step 928, microcontroller 32 can determine if the current flowing to load 20, based on the voltage read at step 920, is greater than a first predetermined threshold. If microcontroller 32 determines that the current is flowing to load 20 is not above the first predetermined threshold, then LED elements within LED display 30 commensurate with the first predetermined threshold can be turned off (or kept off as the case may be) at step 936. If microcontroller 32 determines that the current flowing to load 20 is above the first predetermined threshold, then LED elements within LED display 30 commensurate with the first predetermined threshold can be turned on (or kept on as the case may be) at step 932. At step 940, microcontroller 32 can determine if the current flowing to load 20, based on the voltage read at step 920, is greater than a second predetermined threshold. If microcontroller 32 determines that the current is flowing to load 20 is not above the second predetermined threshold, then LED elements within LED display 30 commensurate with the second predetermined threshold can be turned off (or kept off as the case may be) at step 948. If microcontroller 32 determines that the current flowing to load 20 is above the second predetermined threshold, then LED elements within LED display 30 commensurate with the second predetermined threshold can be turned on (or kept on as the case may be) at step 944. Similarly, the foregoing steps can be repeated for 'n' predetermined thresholds. Thus, at step 952, microcontroller 32 can determine if the current flowing to load 20, based on the voltage read at step 920, is greater than an "$n^{th}$" predetermined threshold. If microcontroller 32 determines that the current is flowing to load 20 is not above the $n^{th}$ predetermined threshold, then LED elements within LED display 30 commensurate with the $n^{th}$ predetermined threshold can be turned off (or kept off as the case may be) at step 960. If microcontroller 32 determines that the current flowing to load 20 is above the $n^{th}$ predetermined threshold, then LED elements within LED display 30 commensurate with the $n^{th}$ predetermined threshold can be turned on (or kept on as the case may be) at step 956. In some embodiments, from any one of steps 932, 936, 944, 948, 956 and 960, process 900 can then return to step 920 and repeat the steps therefrom.

Figure 10:
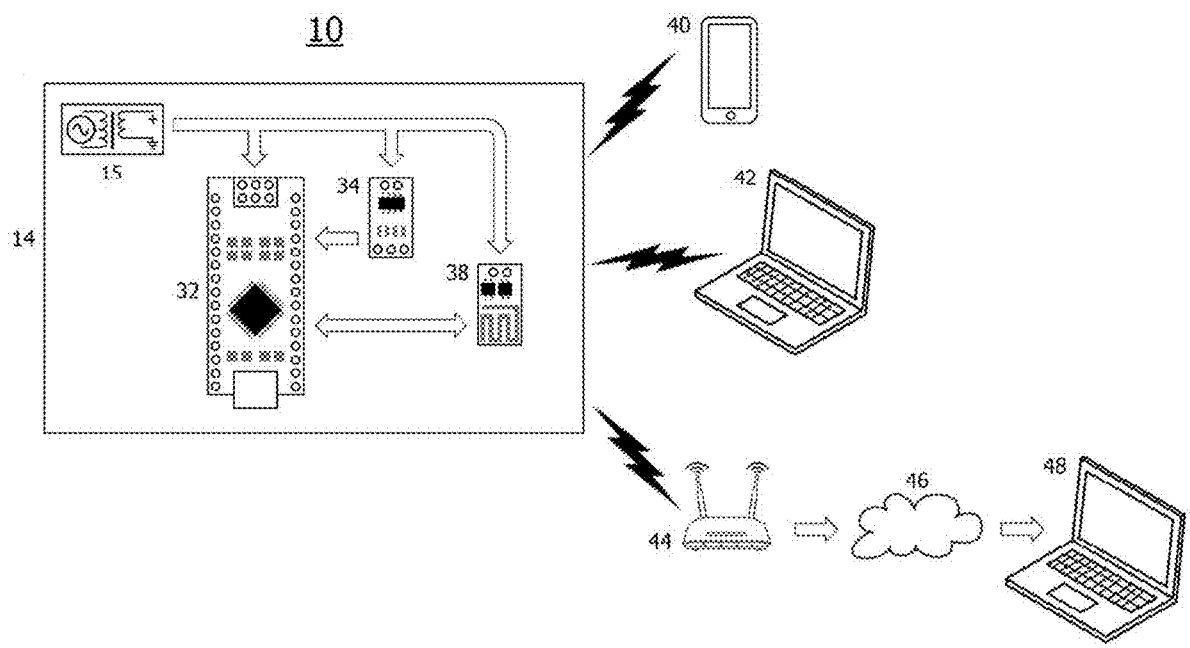
FIG. 10 is a block diagram depicting a controller circuit for use with a third embodiment of the apparatus of FIG. 5.
Figure 11:
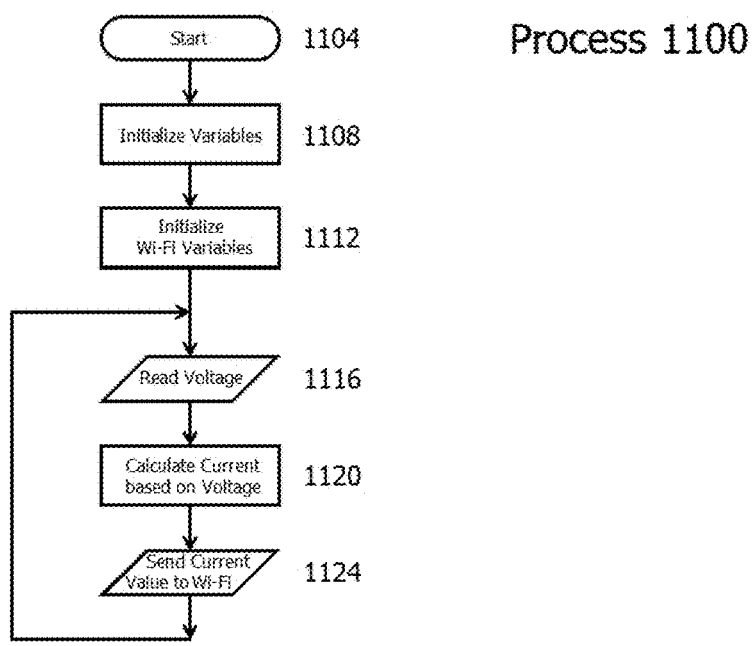
FIG. 11 is a flow chart depicting one embodiment of steps carried out by the apparatus of FIG. 10.

Referring to FIG. 10, an alternate embodiment of module 14 is shown that can be used in a third embodiment of apparatus 10. In some embodiments, module 14 can further comprise Wi-Fi® transceiver module 38 operatively coupled to microcontroller 32 wherein microcontroller 32 can be programmed with an executable software program or code that can cause microcontroller 32 to relay information related to the amount of electrical current flowing through current sensor 34 to module 38 that can then be transmitted wirelessly to one or more of smart device 40, general purpose computer 42, and modem 44 that can, in turn, be connected to a world-wide telecommunications network 46, such as the internet, to connect with computing device 48, which can comprise of one or more general purpose computers, servers, smart phones, smart tablets, and other computing devices as well known to those skilled in the art. In some embodiments, Wi-Fi® module 38 can comprise of an ESP8266 Wi-Fi® module as manufactured by Arduino SA of Chiasso, Switzerland although any similarly functioning Wi-Fi® module can be used as well known to those skilled in the art. Referring to FIG. 11, one embodiment of process 1100 that can be carried out by apparatus 10 of FIG. 10 is shown. In some embodiments, process 1100 can start at step 1104 and then initialize operating variables of microcontroller 32 at step 1108. At step 1112, the Wi-Fi® variables can be initialized. At step 1112, microcontroller 32 can read an output voltage from current sensor 34 that can be proportional to the current from connector 12 to load 20. At step 1120, microcontroller 32 can calculate the current flowing to load 20 from the voltage read from current sensor 34. At step 1124, microcontroller 32 can transmit the calculated current read at step 1120 via Wi-Fi® module 38 to one or more of smart device 40, general purpose computer 42, and modem 44. In some embodiments, from step 1124, process 1100 can then return to step 1116 and repeat the steps therefrom.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the embodiments described herein.

Embodiments implemented in computer software can be implemented in software, firmware, middleware, microcode, hardware description languages, or any combination thereof. A code segment or machine-executable instructions can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted via any suitable means including memory sharing, message passing, token passing, network transmission, etc.

The actual software code or specialized control hardware used to implement these systems and methods is not limiting of the embodiments described herein. Thus, the operation and behavior of the systems and methods were described without reference to the specific software code being understood that software and control hardware can be designed to implement the systems and methods based on the description herein.

When implemented in software, the functions can be stored as one or more instructions or code on a non-transitory computer-readable or processor-readable storage medium. The steps of a method or algorithm disclosed herein can be embodied in a processor-executable software module, which can reside on a computer-readable or processor-readable storage medium. A non-transitory computer-readable or processor-readable media includes both computer storage media and tangible storage media that facilitate transfer of a computer program from one place to another. A non-transitory processor-readable storage media can be any available media that can be accessed by a computer. By way of example, and not limitation, such non-transitory processor-readable media can comprise RAM, ROM, EEPROM, CD-ROM or other optical disk storage, magnetic disk storage or other magnetic storage devices, or any other tangible storage medium that can be used to store desired program code in the form of instructions or data structures and that can be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm can reside as one or any combination or set of codes and/or instructions on a non-transitory processor-readable medium and/or computer-readable medium, which can be incorporated into a computer program product.

Although a few embodiments have been shown and described, it will be appreciated by those skilled in the art that various changes and modifications can be made to these embodiments without changing or departing from their scope, intent or functionality. The terms and expressions used in the preceding specification have been used herein as terms of description and not of limitation, and there is no intention in the use of such terms and expressions of excluding equivalents of the features shown and described or portions thereof, it being recognized that the invention is defined and limited only by the claims that follow.

I claim:

1. An apparatus for detecting electrical current flowing through an electrical connector to an electrical load connected thereto, the apparatus comprising:
    a) a current sensor operatively coupled to the connector wherein the current sensor is configured to detect the flow of the electrical current through the connector, wherein the electrical current flows through the current sensor;
    b) a microcontroller operatively coupled to the current sensor; and
    c) a visual display device operatively coupled to the microcontroller wherein the microcontroller comprises a first executable software program or code that causes the microcontroller to illuminate the visual display device when the electrical current is flowing through the connector.

2. The apparatus as set forth in claim 1, further comprising a wireless transceiver module operatively coupled to the microcontroller, wherein the microcontroller comprises another executable software program or code that causes the microcontroller to relay information relating to the electrical current flowing through the electrical connector to the wireless transceiver module, the wireless transceiver module configured to wirelessly transmit the information to one or more of a smart device, a general purpose computer and a world-wide telecommunications network.

3. The apparatus as set forth in claim 1, wherein the visual display device comprises at least one light emitting diode (LED).

4. The apparatus as set forth in claim 3, wherein the microcontroller comprises a second executable software program or code that causes the microcontroller to illuminate the at least one LED when the electrical current is flowing through the connector, the number of the at least one LED illuminated proportional to the amount of the electrical current flowing through the electrical connector.

5. The apparatus as set forth in claim 4, further comprising a wireless transceiver module operatively coupled to the microcontroller, wherein the microcontroller comprises another executable software program or code that causes the microcontroller to relay information relating to the electrical current flowing through the electrical connector to the wireless transceiver module, the wireless transceiver module configured to wirelessly transmit the information to one or more of a smart device, a general purpose computer and a world-wide telecommunications network.

6. The apparatus as set forth in claim 1, wherein the visual display comprises a plurality of different coloured light emitting diodes (LEDs) or an LED configured to emit different colours of light.

7. The apparatus as set forth in claim 6, wherein the microcontroller comprises a third executable software program or code that causes the microcontroller to illuminate one or more of the plurality of different coloured LEDs when the electrical current is flowing through the connector, the colour of the plurality of different coloured LEDs illuminated being a function of the amount of the electrical current flowing through the electrical connector.

8. The apparatus as set forth in claim 7, further comprising a wireless transceiver module operatively coupled to the microcontroller, wherein the microcontroller comprises a fourth executable software program or code that causes the microcontroller to relay information relating to the electrical current flowing through the electrical connector to the wireless transceiver module, the wireless transceiver module configured to wirelessly transmit the information to one or more of a smart device, a general purpose computer and a world-wide telecommunications network.

9. The apparatus as set forth in claim 6, wherein the microcontroller comprises a third executable software program or code that causes the microcontroller to operate the visual display to emit light when the electrical current is flowing through the connector, the colour of the emitted light representing the amount of the electrical current flowing through the electrical connector.

10. The apparatus as set forth in claim 9, further comprising a wireless transceiver module operatively coupled to the microcontroller, wherein the microcontroller comprises a fourth executable software program or code that causes the microcontroller to relay information relating to the electrical current flowing through the electrical connector to the wireless transceiver module, the wireless transceiver module configured to wirelessly transmit the information to one or more of a smart device, a general purpose computer and a world-wide telecommunications network.

11. A method for detecting electrical current flowing through an electrical connector to an electrical load connected thereto, the method comprising:
 a) detecting the current flow through the electrical connector with a current sensor wherein the electrical current flows through the current sensor, the current sensor operatively coupled to a microcontroller; and
 b) illuminating a visual display device with the microcontroller, wherein the microcontroller comprises a first executable software program or code that causes the microcontroller to illuminate the visual display device when the electrical current is flowing through the connector.

12. The method as set forth in claim 11, further comprising wirelessly transmitting information relating to the electrical current flowing through the electrical connector to one or more of a smart device, a general purpose computer and a world-wide telecommunications network with a wireless transceiver module, wherein the microcontroller comprises another executable software program or code that causes the microcontroller to relay the information to the wireless transceiver module.

13. The method as set forth in claim 11, wherein the visual display device comprises at least one light emitting diode (LED).

14. The method as set forth in claim 13, further comprising illuminating the at least one LED with the microcontroller, wherein the microcontroller comprises a second executable software program or code that causes the microcontroller to illuminate the at least one LED when the electrical current is flowing through the connector, the at least one LED illuminated proportional to the amount of the electrical current flowing through the electrical connector.

15. The method as set forth in claim 14, further comprising wirelessly transmitting information relating to the electrical current flowing through the electrical connector to one or more of a smart device, a general purpose computer and a world-wide telecommunications network with a wireless transceiver module, wherein the microcontroller comprises another executable software program or code that causes the microcontroller to relay the information to the wireless transceiver module.

16. The method as set forth in claim 11, wherein the visual display device comprises a plurality of different coloured light emitting diodes (LEDs) or an LED configured to emit different colours of light.

17. The method as set forth in claim 16, further comprising illuminating one or more of the plurality of different coloured LEDs with the microcontroller, wherein the microcontroller comprises a third executable software program or code that causes the microcontroller to illuminate one or more of the plurality of different coloured LEDs when the electrical current is flowing through the connector, the colour of the plurality of different coloured LEDs illuminated being a function of the amount of the electrical current flowing through the electrical connector.

18. The method as set forth in claim 17, further comprising wirelessly transmitting information relating to the electrical current flowing through the electrical connector to one or more of a smart device, a general purpose computer and a world-wide telecommunications network with a wireless transceiver module, wherein the microcontroller comprises a fourth executable software program or code that causes the microcontroller to relay the information to the wireless transceiver module.

19. The method as set forth in claim 16, further comprising operating the visual device with the microcontroller, wherein the microcontroller comprises a third executable software program or code that causes the microcontroller to operate the visual display to emit light when the electrical current is flowing through the connector, the colour of the emitted light representing the amount of the electrical current flowing through the electrical connector.

20. The method as set forth in claim 19, further comprising wirelessly transmitting information relating to the electrical current flowing through the electrical connector to one or more of a smart device, a general purpose computer and a world-wide telecommunications network with a wireless transceiver module, wherein the microcontroller comprises a fourth executable software program or code that causes the microcontroller to relay the information to the wireless transceiver module.

* * * * *